(12) United States Patent
Shimizu et al.

(10) Patent No.: US 9,459,389 B2
(45) Date of Patent: Oct. 4, 2016

(54) POLARIZING PLATE AND ORGANIC EL PANEL

(71) Applicant: NITTO DENKO CORPORATION, Ibaraki-shi, Osaka (JP)

(72) Inventors: Takashi Shimizu, Ibaraki (JP); Nao Murakami, Ibaraki (JP); Kazuki Uwada, Ibaraki (JP); Tadashi Kojima, Ibaraki (JP); Hironori Yaginuma, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/405,301

(22) PCT Filed: Jun. 24, 2013

(86) PCT No.: PCT/JP2013/067192
§ 371 (c)(1),
(2) Date: Dec. 3, 2014

(87) PCT Pub. No.: WO2014/002929
PCT Pub. Date: Jan. 3, 2014

(65) Prior Publication Data
US 2015/0116826 A1    Apr. 30, 2015

(30) Foreign Application Priority Data
Jun. 29, 2012 (JP) ................. 2012-146765

(51) Int. Cl.
*G02B 5/30* (2006.01)
*H01L 51/52* (2006.01)

(52) U.S. Cl.
CPC ........... *G02B 5/3041* (2013.01); *G02B 5/3025* (2013.01); *G02B 5/3033* (2013.01); *G02B 5/3083* (2013.01); *H01L 51/5281* (2013.01)

(58) Field of Classification Search
CPC   G02B 5/3041; G02B 5/3025; G02B 5/3083; H01L 51/5281
USPC ....... 359/489.07; 349/18, 117–121; 313/110, 313/112
See application file for complete search history.

(56) References Cited

U.S. PATENT DOCUMENTS

| 6,433,845 B1 * | 8/2002 | Suzuki | ................. G02F 1/1396 349/102 |
| 6,443,845 B1 | 9/2002 | Hiraga et al. | |

(Continued)

FOREIGN PATENT DOCUMENTS

| CN | 102681194 A | 9/2012 |
| EP | 1 072 930 A2 | 1/2001 |

(Continued)

OTHER PUBLICATIONS

Taiwanese Office Action dated Jan. 16, 2015, issued in correspomding TW Patent Application No. 102123378 with English translation (7 pages).

(Continued)

*Primary Examiner* — Frank Font
(74) *Attorney, Agent, or Firm* — Westerman, Hattori, Daniels & Adrian, LLP

(57) ABSTRACT

There is provided a polarizing plate that achieves an excellent reflection hue. A polarizing plate according to an embodiment of the present invention is used in an organic EL panel, and includes a polarizer and a retardation film. In-plane retardations of the retardation film satisfy a relationship of Re(450)<Re(550); and an angle θ formed between an absorption axis of the polarizer and a slow axis of the retardation film satisfies a relationship of 38°≤θ≤44° or of 46°≤θ≤52°.

11 Claims, 2 Drawing Sheets

(56) References Cited

U.S. PATENT DOCUMENTS

| | | | |
|---|---|---|---|
| 7,166,339 B1* | 1/2007 | Mori | G02B 5/3083 349/117 |
| 7,410,680 B2* | 8/2008 | Fujisawa | C08B 3/10 349/117 |
| 8,314,987 B2 | 11/2012 | Goto et al. | |
| 8,320,042 B2 | 11/2012 | Goto et al. | |
| 8,379,169 B2 | 2/2013 | Kitagawa et al. | |
| 8,411,360 B2 | 4/2013 | Kitagawa et al. | |
| 8,520,169 B2 | 8/2013 | Kitagawa et al. | |
| 8,520,171 B2 | 8/2013 | Kitagawa et al. | |
| 8,709,567 B2 | 4/2014 | Kitagawa et al. | |
| 8,721,816 B2 | 5/2014 | Kitagawa et al. | |
| 8,771,454 B2 | 7/2014 | Goto et al. | |
| 8,852,374 B2 | 10/2014 | Goto et al. | |
| 8,911,837 B2 | 12/2014 | Ohmori et al. | |
| 2003/0218709 A1* | 11/2003 | Ito | G02B 5/3083 349/117 |
| 2005/0225696 A1 | 10/2005 | Matsushima | |
| 2007/0036916 A1* | 2/2007 | Fujisawa | C08B 3/10 428/1.3 |
| 2007/0190268 A1* | 8/2007 | Nakayama | C08J 5/18 428/1.3 |
| 2009/0167999 A1 | 7/2009 | Ohmori et al. | |
| 2012/0055607 A1 | 3/2012 | Kitagawa et al. | |
| 2012/0055608 A1 | 3/2012 | Kitagawa et al. | |
| 2012/0055621 A1 | 3/2012 | Goto et al. | |
| 2012/0055622 A1 | 3/2012 | Kitagawa et al. | |
| 2012/0055623 A1 | 3/2012 | Kitagawa et al. | |
| 2012/0056211 A1 | 3/2012 | Kitagawa et al. | |
| 2012/0056340 A1 | 3/2012 | Kitagawa et al. | |
| 2012/0057104 A1 | 3/2012 | Kitagawa et al. | |
| 2012/0057107 A1 | 3/2012 | Kitagawa et al. | |
| 2012/0057231 A1 | 3/2012 | Goto et al. | |
| 2012/0057232 A1 | 3/2012 | Goto et al. | |
| 2012/0058291 A1 | 3/2012 | Kitagawa et al. | |
| 2012/0058321 A1 | 3/2012 | Goto et al. | |
| 2012/0229719 A1 | 9/2012 | Ishiguro | |
| 2013/0100529 A1 | 4/2013 | Kitagawa et al. | |
| 2013/0114139 A1 | 5/2013 | Kitagawa et al. | |
| 2013/0249378 A1* | 9/2013 | Murakami | C08J 5/18 313/112 |
| 2014/0186568 A1 | 7/2014 | Kitagawa et al. | |
| 2015/0109667 A1 | 4/2015 | Shimizu et al. | |

FOREIGN PATENT DOCUMENTS

| | | |
|---|---|---|
| JP | 2004-37988 A | 2/2004 |
| JP | 2004-195875 A | 7/2004 |
| JP | 2005-189645 A | 7/2005 |
| JP | 2005-292732 A | 10/2005 |
| JP | 2009-251017 A | 10/2009 |
| JP | 2009-259721 A | 11/2009 |
| JP | 4751481 B1 | 8/2011 |
| JP | 2012-31332 A | 2/2012 |
| JP | 2012-078539 | 4/2012 |
| JP | 2012-189687 A | 10/2012 |
| JP | 2013-97279 A | 5/2013 |
| JP | 2014-44394 A | 3/2014 |
| TW | 200819873 A | 5/2008 |
| WO | 2009/025170 A1 | 2/2009 |
| WO | 2012/077663 A1 | 6/2012 |

OTHER PUBLICATIONS

International Search Report dated Jul. 23, 2013 issued in corresponding application No. PCT/JP2013/067192.

Extended European Search Report dated, Jan. 15, 2016. issued in counterpart European Application No. 13809665.6 (6 pages).

Office Action dated Feb. 26, 2016, issued in counterpart Korean Application No. 10-2014-7036579, w/English translation (12 pages).

Office Action dated Mar. 16, 2016, issued in counterpart Japanese Patent Application No. 2012-146765, with English translation. (9 pages).

Office Action dated Apr. 15, 2016, issued in counterpart Chinese Patent Application No. 201380034759.5, with English translation. (12 pages).

* cited by examiner

POLARIZING PLATE AND ORGANIC EL PANEL

TECHNICAL FIELD

The present invention relates to a polarizing plate and an organic EL panel.

BACKGROUND ART

In recent years, a display mounted with an organic EL panel has been proposed in association with widespread use of a thin display. The organic EL panel is liable to cause problems such as ambient light reflection and background reflection because the panel includes a metal layer having high reflectivity. In view of the foregoing, it has been known that those problems are prevented by providing a circularly polarizing plate on a viewer side (for example, Patent Literature 1). However, when the circularly polarizing plate is provided on the viewer side of the organic EL panel, a problem in that an excellent reflection hue is not obtained arises.

CITATION LIST

Patent Literature

[PTL 1] JP 2005-189645 A

SUMMARY OF INVENTION

Technical Problem

The present invention has been made to solve the above-mentioned problems, and a main object of the present invention is to provide a polarizing plate that achieves an excellent reflection hue.

Solution to Problem

The inventors of the present invention have made extensive studies on a relationship between a retardation film and a reflection hue. As a result, the inventors have found that the problem concerning the reflection hue is related to the uniformity (retardation unevenness) of the retardation of the retardation film (typically a stretched film), and the object can be achieved by adjusting an optical axis angle between a polarizer and the retardation film, and have completed the present invention.

A polarizing plate according to an embodiment of the present invention is used in an organic EL panel, and includes a polarizer and a retardation film. In-plane retardations of the retardation film satisfy a relationship of $Re(450)<Re(550)$; and an angle $\theta$ formed between an absorption axis of the polarizer and a slow axis of the retardation film satisfies a relationship of $38°\leq\theta\leq44°$ or of $46°\leq\theta\leq52°$. Here, $Re(450)$ represents an in-plane retardation measured at 23° C. with light having a wavelength of 450 nm and $Re(550)$ represents an in-plane retardation measured at 23° C. with light having a wavelength of 550 nm.

In one embodiment of the present invention, the polarizing plate is free of an optically anisotropic layer between the polarizer and the retardation film.

In one embodiment of the present invention, the in-plane retardation $Re(550)$ of the retardation film is from 130 nm to 160 nm.

In one embodiment of the present invention, the retardation film has an Nz coefficient of from 1.05 to 1.3.

According to another aspect of the present invention, an organic EL panel is provided. The organic EL panel includes the polarizing plate as described above.

Advantageous Effects of Invention

According to one embodiment of the present invention, when the polarizer and the retardation film satisfying a relationship of $Re(450)<Re(550)$ are arranged so that the angle $\theta$ formed between the absorption axis of the polarizer and the slow axis of the retardation film may satisfy a relationship of $38°\leq\theta\leq44°$ or of $46°\leq\theta\leq52°$, an excellent reflection hue can be achieved while an antireflection function is maintained.

DESCRIPTION OF EMBODIMENTS

Hereinafter, preferred embodiments of the present invention are described. However, the present invention is not limited to these embodiments.

DEFINITIONS OF TERMS AND SYMBOLS

The definitions of terms and symbols used herein are as follows.

(1) Refractive Indices (nx, ny, and nz)

A symbol "nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.

(2) in-Plane Retardation (Re)

The term "Re(550)" refers to the in-plane retardation of a film measured at 23° C. with light having a wavelength of 550 nm. The Re(550) is determined from the equation "Re=(nx−ny)×d" when the thickness of the film is represented by d (nm). It should be noted that the term "Re(450)" refers to the in-plane retardation of the film measured at 23° C. with light having a wavelength of 450 nm.

(3) Thickness Direction Retardation (Rth)

The term "Rth(550)" refers to the thickness direction retardation of the film measured at 23° C. with light having a wavelength of 550 nm. The Rth(550) is determined from the equation "Rth=(nx−nz)×d" when the thickness of the film is represented by d (nm). It should be noted that the term "Rth(450)" refers to the thickness direction retardation of the film measured at 23° C. with light having a wavelength of 450 nm.

(4) Nz Coefficient

An Nz coefficient is determined from the equation "Nz=Rth/Re".

A. Polarizing Plate

A polarizing plate of the present invention includes a polarizer and a retardation film, and the retardation film is laminated on one side of the polarizer. The polarizing plate is preferably free of an optically anisotropic layer (such as a liquid crystal layer or another retardation film) between the polarizer and the retardation film. Hereinafter, a specific example thereof is described.

Figure 1A:
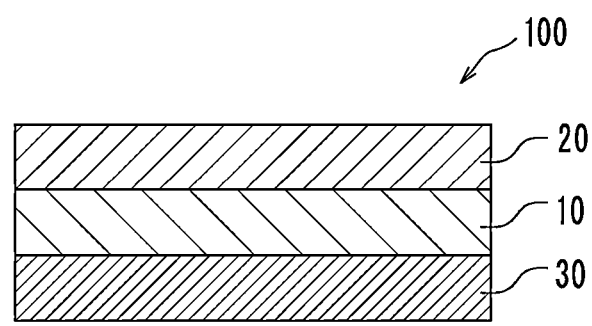
FIG. 1(a) is a schematic sectional view of a polarizing plate according to a preferred embodiment of the present invention and FIG. 1(b) is a schematic sectional view of a polarizing plate according to another preferred embodiment of the present invention.

FIG. 1(a) is a schematic sectional view of a polarizing plate according to a preferred embodiment of the present invention. A polarizing plate 100 according to this embodiment includes a polarizer 10, a protective film 20 arranged on one side of the polarizer 10, and a retardation film 30 arranged on the other side of the polarizer 10. In this embodiment, the retardation film 30 can also function as a protective layer for the polarizer 10. In addition, when the polarizer and the retardation film are directly bonded to each other as described above, an additionally excellent reflection hue (especially a viewing angle characteristic) can be achieved.

Figure 1B:
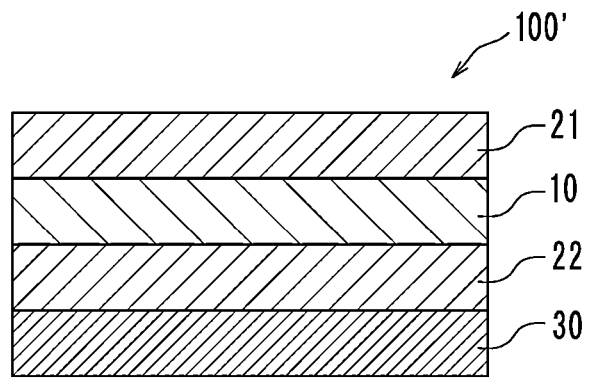

FIG. 1(b) is a schematic sectional view of a polarizing plate according to another preferred embodiment of the present invention. A polarizing plate 100' includes the polarizer 10, a first protective film 21 arranged on one side of the polarizer 10, the retardation film 30 arranged on the other side of the polarizer 10, and a second protective film 22 arranged between the polarizer 10 and the retardation film 30. It is preferred that the second protective film 22 be optically isotropic. When the second protective film is optically isotropic, an additionally excellent reflection hue (especially a viewing angle characteristic) can be achieved.

The refractive index characteristic of the retardation film 30 shows a relationship of nx>ny, and the retardation film 30 has a slow axis. The polarizer 10 and the retardation film 30 are laminated so that the absorption axis of the polarizer 10 and the slow axis of the retardation film 30 may form a predetermined angle. An angle θ formed between the absorption axis of the polarizer 10 and the slow axis of the retardation film 30 satisfies a relationship of 38°≤θ≤44° or 46°≤θ≤52°, preferably 39°≤θ≤43° or 47°≤θ≤51°.

The total thickness of the polarizing plate of the present invention is typically from about 50 µm to 250 µm, depending on its construction. Hereinafter, each layer constituting the polarizing plate of the present invention is described.

A-1. Polarizer

Any appropriate polarizer may be adopted as the polarizer. Specific examples thereof include: a product obtained by subjecting a hydrophilic polymer film such as a polyvinyl alcohol-based film, a partially formalized polyvinyl alcohol-based film, or an ethylene-vinyl acetate copolymer-based partially saponified film to dyeing treatment with a dichromatic substance such as iodine or a dichromatic dye and stretching treatment; and a polyene-based alignment film such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the resultant is preferably used because of its excellent optical characteristics.

The dyeing with iodine is performed by, for example, immersing the polyvinyl alcohol-based film in an aqueous solution of iodine. The stretching ratio of the uniaxial stretching is preferably from 3 to 7 times. The stretching may be performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like.

The thickness of the polarizer is typically from about 1 µm to 80 µm.

A-2. Retardation Film

As described above, the refractive index characteristic of the retardation film shows a relationship of nx>ny. The in-plane retardation Re(550) of the retardation film is preferably from 130 nm to 160 nm, more preferably from 135 nm to 155 nm.

The retardation film shows the so-called reverse wavelength dispersion dependency. Specifically, its in-plane retardations satisfy a relationship of Re(450)<Re(550). An excellent reflection hue can be achieved by satisfying such relationship. Further, the effect based on the adjustment of an optical axis angle between the polarizer and the retardation film can be remarkably obtained. A ratio "Re(450)/Re (550)" is preferably 0.94 or less, more preferably 0.92 or less.

The retardation film shows any appropriate refractive index ellipsoid as long as the film has the relationship of nx>ny. The refractive index ellipsoid of the retardation film preferably shows a relationship of nx>ny≥nz. The Nz coefficient of the retardation film is preferably from 1.05 to 1.3. An additionally excellent reflection hue (especially a viewing angle characteristic) can be achieved by satisfying such relationships.

The retardation film is formed of any appropriate resin capable of satisfying the above-mentioned optical characteristics. Examples of the resin forming the retardation film include a polycarbonate resin, a polyester resin, a polyester carbonate resin, a polyurethane resin, a cellulose-based resin, a polyvinyl acetal resin, and an acrylic resin. Of those, a polycarbonate resin is preferably used.

In a preferred embodiment, the polycarbonate resin can be produced by, for example, a melt polymerization method involving causing a dihydroxy compound and a carbonic acid diester to react with each other. Examples of the carbonic acid diester in this case include: a diaryl carbonate that may have a substituent such as diphenyl carbonate or ditolyl carbonate; and a dialkyl carbonate such as dimethyl carbonate, diethyl carbonate, or di-t-butyl carbonate. Of those, a diaryl carbonate that may have a substituent such as diphenyl carbonate or ditolyl carbonate is preferably used, and diphenyl carbonate is particularly preferably used. One kind of those carbonic acid diesters may be used alone, or two or more kinds thereof may be used as a mixture. It should be noted that the carbonic acid diester is preferably purified by distillation or the like as required before use because the diester may contain an impurity such as a chloride ion, and hence may inhibit a polymerization reaction or deteriorate the hue of the polycarbonate resin to be obtained.

Part of the carbonic acid diester may be substituted with a dicarboxylic acid or an ester thereof in an amount corresponding to 50 mol % or less, preferably 30 mol % or less of the diester. Terephthalic acid, isophthalic acid, diphenyl terephthalate, diphenyl isophthalate, or the like is used as such dicarboxylic acid or ester thereof. When part of the carbonic acid diester is substituted with a dicarboxylic acid or an ester thereof, the polycarbonate resin may be referred to as "polyester carbonate resin".

As described above, the polycarbonate resin of this embodiment can be produced by, for example, the melt polymerization method involving causing the dihydroxy compound and the carbonic acid diester to react with each other. Although any compound can be used as the dihydroxy compound to be used as long as the compound can typically produce a polycarbonate resin, at least one kind of dihydroxy compound is preferably a dihydroxy compound having an etheric oxygen atom at at least one β- or γ-position of a carbon atom bonded to a hydroxy group. It should be noted that the "etheric oxygen atom" in the dihydroxy compound of this embodiment means that an oxygen atom is singly bonded to two carbon atoms, and is distinguished from an oxygen atom constituting a hydroxyl group or a carbonyl group. In addition, the β- or γ-position in the "dihydroxy compound having an etheric oxygen atom at at least one β- or γ-position of a carbon atom bonded to a hydroxy group" has the following meaning: with reference to the carbon atom bonded to the hydroxy group in the dihydroxy compound, the position of an adjacent carbon atom is defined as an α-position, the position of a carbon atom adjacent to the carbon atom at the α-position is defined as the β-position, and the position of a carbon atom adjacent to the carbon atom at the β-position is defined as the γ-position. In the case of, for example, isosorbide to be described later, a carbon atom corresponding to the β-position with reference to a carbon atom bonded to a hydroxy group is replaced with an etheric oxygen atom. Accordingly, isosorbide corresponds to an "aliphatic dihydroxy compound having an etheric oxygen atom at the β-position of a carbon atom bonded to a hydroxy group."

It is preferred that the etheric oxygen atom be part of a structure represented by the following formula (1), specifically be bonded to at least a methylene group.

  (1)

The dihydroxy compound having an etheric oxygen atom is preferably a dihydroxy compound represented by the following formula (2).

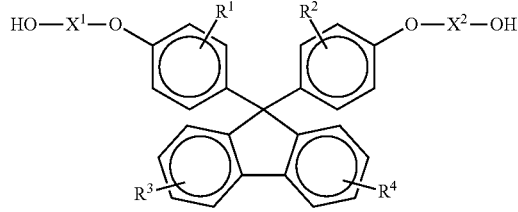  (2)

In the formula (2), $R^1$ to $R^4$ each independently represent a hydrogen atom, an alkyl group having 1 to 20 carbon atoms that may have a substituent, a cycloalkyl group having 6 to 20 carbon atoms that may have a substituent, or an aryl group having 6 to 20 carbon atoms that may have a substituent, and $R^1$ to $R^4$ may each independently be present in plurality for the corresponding ring, and $X^1$ and $X^2$ each represent an alkylene group having 2 to 10 carbon atoms that may have a substituent, a cycloalkylene group having 6 to 20 carbon atoms that may have a substituent, or an arylene group having 6 to 20 carbon atoms that may have a substituent.

In addition, the dihydroxy compound having an etheric oxygen atom is preferably a dihydroxy compound represented by the following formula (3).

  (3)

(In the general formula (3), $R^7$ represents a substituted or unsubstituted alkylene group having 2 to 10 carbon atoms, and p represents an integer of from 2 to 100.)

Examples of the other dihydroxy compounds each having an etheric oxygen atom include compounds each having a cyclic ether structure. Of the compounds each having a cyclic ether structure, a compound having a plurality of etheric oxygen atoms is preferred and a compound having a plurality of cyclic structures is preferred. In addition, a compound having a plurality of cyclic ether structures is more preferred. More specific examples thereof include compounds having such cyclic ether structures as typified by the following formulae (4) and (5).

  (4)

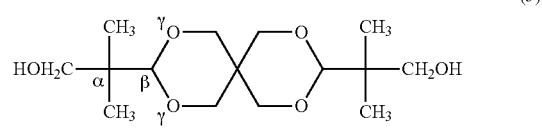  (5)

Examples of the dihydroxy compound represented by the formula (4) include isosorbide, isomannide, and isoidet in a stereoisomeric relationship. Of those dihydroxy compounds, isosorbide obtained by subjecting sorbitol produced from various kinds of starch abundantly present as resources and easily available to dehydration condensation is most preferred in terms of ease of availability, ease of production, optical characteristics, and formability.

<Dihydroxy Compound Represented by the Formula (2)>

More specific examples of the dihydroxy compound represented by the general formula (2) include compounds each having an etheric oxygen atom bonded to an aromatic group typified by the general formula (2) such as 9,9-bis(4-(2-hydroxyethoxyl)phenyl)fluorene, 9,9-bis(4-(2-hydroxyethoxy)-3-methylphenyl)fluorene, 9,9-bis(4-(2-hydroxyethoxy)-3-isopropylphenyl)fluorene, 9,9-bis(4-(2-hydroxyethoxy)-3-isobutylphenyl)fluorene, 9,9-bis(4-(2-hydroxyethoxy)-3-tert-butylphenyl)fluorene, 9,9-bis(4-(2-hydroxyethoxy)-3-cyclohexylphenyl)fluorene, 9,9-bis(4-(2-hydroxyethoxy)-3-phenylphenyl)fluorene, 9,9-bis(4-(2-hydroxyethoxy)-3,5-dimethylphenyl)fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene.

<Dihydroxy Compound Represented by the Formula (3)>

Specific examples of the dihydroxy compound represented by the formula (3) include oxyalkylene glycols such as diethylene glycol, triethylene glycol, tetraethylene glycol, and polyethylene glycol (molecular weight: 150 to 2,000). Of those, diethylene glycol or polyethylene glycol is preferred.

One kind of the dihydroxy compounds each having an etheric oxygen atom may be used alone, or two or more kinds thereof may be used in combination depending on performance required for the polycarbonate resin to be obtained.

In one embodiment, the polycarbonate resin preferably contains a structural unit derived from the dihydroxy compound represented by the formula (2), a structural unit derived from the dihydroxy compound represented by the formula (3), and a structural unit derived from the dihydroxy compound represented by the formula (4).

<Dihydroxy Compound Other than Dihydroxy Compound Having Etheric Oxygen Atom>

When the polycarbonate resin of this embodiment is produced by the melt polymerization method involving causing the dihydroxy compound and the carbonic acid diester to react with each other, a dihydroxy compound other than the dihydroxy compound having an etheric oxygen atom is preferably used in combination in order to, for example, improve the toughness of a film to be produced from the resin to be obtained.

The dihydroxy compound other than the dihydroxy compound having an etheric oxygen atom is more specifically, for example, one or more kinds of dihydroxy compounds selected from the group consisting of a dihydroxy compound represented by the following formula (6) and a dihydroxy compound represented by the following formula (7).

HO—R$_5$—OH            (6)

(In the general formula (6), R$_5$ represents a substituted or unsubstituted cycloalkylene group of a monocyclic structure having 4 to 20 carbon atoms.)

HO—CH$_2$—R$_6$—CH$_2$—OH            (7)

(In the general formula (7), R$_6$ represents a substituted or unsubstituted cycloalkylene group of a monocyclic structure having 4 to 20 carbon atoms.)

<Dihydroxy Compound Represented by the General Formula (6)>

The dihydroxy compound represented by the general formula (6) is, for example, a compound including a cycloalkylene group of a monocyclic structure (alicyclic dihydroxy compound). Adopting the monocyclic structure can improve toughness when the polycarbonate resin to be obtained is shaped into a film. Typical examples of the alicyclic dihydroxy compound include compounds each including a five-membered ring structure or a six-membered ring structure. Adopting the five-membered ring structure or the six-membered ring structure can improve the heat resistance of the polycarbonate resin to be obtained. The six-membered ring structure may be fixed by a covalent bond in a chair form or a boat form. Specific examples thereof include 1,2-cyclopentanediol, 1,3-cyclopentanediol, 1,2-cyclohexanediol, 1,3-cyclohexanediol, 1,4-cyclohexanediol, and 2-methyl-1,4-cyclohexanediol. One kind of the dihydroxy compounds each represented by the general formula (6) may be used alone, or two or more kinds thereof may be used in combination.

<Dihydroxy Compound Represented by the General Formula (7)>

The dihydroxy compound represented by the general formula (7) is, for example, a compound including a cycloalkylene group of a monocyclic structure (alicyclic dihydroxy compound). Adopting the monocyclic structure can improve toughness when the polycarbonate resin to be obtained is shaped into a film. Typical examples of the alicyclic dihydroxy compound include various isomers in each of which R$_6$ in the general formula (7) is represented by the following general formula (Ia) (where R$_7$ represents a hydrogen atom, or a substituted or unsubstituted alkyl group having 1 to 12 carbon atoms). Preferred specific examples of such isomers include 1,2-cyclohexanedimethanol, 1,3-cyclohexanedimethanol, and 1,4-cyclohexanedimethanol. Those compounds are easily available and excellent in handling property. One kind of the dihydroxy compounds each represented by the general formula (7) may be used alone, or two or more kinds thereof may be used in combination.

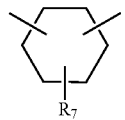

(Ia)

It should be noted that the compounds exemplified in the foregoing with regard to the dihydroxy compounds represented by the general formulae (6) and (7) are each merely an example of the alicyclic dihydroxy compound that may be used, and the compounds used in the present invention are by no means limited thereto.

The polycarbonate resin of this embodiment may further contain a structural unit derived from any other dihydroxy compound. Examples of the other dihydroxy compound include fluorene-based dihydroxy compounds free of an etheric oxygen atom such as 9,9-bis(4-hydroxyphenyl)fluorene, 9,9-bis(4-hydroxy-3-methylphenyl)fluorene, 9,9-bis(4-hydroxy-3-ethylphenyl)fluorene, 9,9-bis(4-hydroxy-3-n-propylphenyl)fluorene, 9,9-bis(4-hydroxy-3-isopropylphenyl)fluorene, 9,9-bis(4-hydroxy-3-n-butylphenyl)fluorene, 9,9-bis(4-hydroxy-3-sec-butylphenyl)fluorene, 9,9-bis(4-hydroxy-3-tert-propylphenyl)fluorene, 9,9-bis(4-hydroxy-3-cyclohexylphenyl)fluorene, and 9,9-bis(4-hydroxy-3-phenylphenyl)fluorene, preferably 9,9-bis(4-hydroxy-3-methylphenyl)fluorene.

Further, another example of the other dihydroxy compound is a bisphenol. Examples of the bisphenol include 2,2-bis(4-hydroxyphenyl)propane[=bisphenol A], 2,2-bis(4-hydroxy-3,5-dimethylphenyl)propane, 2,2-bis(4-hydroxy-3,5-diethylphenyl)propane, 2,2-bis(4-hydroxy-(3,5-diphenyl)phenyl)propane, 2,2-bis(4-hydroxy-3,5-dibromophenyl)propane, 2,2-bis(4-hydroxyphenyl)pentane, 2,4'-dihydroxydiphenylmethane, bis(4-hydroxyphenyl)methane, bis(4-hydroxy-5-nitrophenyl)methane, 1,1-bis(4-hydroxyphenyl)ethane, 3,3-bis(4-hydroxyphenyl)pentane, 1,1-bis(4-hydroxyphenyl)cyclohexane, bis(4-hydroxyphenyl) sulfone, 2,4'-dihydroxydiphenyl sulfone, bis(4-hydroxyphenyl) sulfide, 4,4'-dihydroxydiphenyl ether, 4,4'-dihydroxy-3,3'-dichlorodiphenyl ether, and 4,4'-dihydroxy-2,5-diethoxydiphenyl ether.

The content of the structural unit derived from the dihydroxy compound having an etheric oxygen atom in the polycarbonate resin is 18 mol % or more, preferably 20 mol % or more, more preferably 25 mol % or more. When the content of the structural unit is excessively small, reverse wavelength dispersion dependency may not be obtained.

The content of the structural units derived from one or more kinds of dihydroxy compounds selected from the group consisting of the dihydroxy compound represented by the general formula (3), the dihydroxy compound represented by the general formula (4), the dihydroxy compound represented by the general formula (5), and the dihydroxy compound represented by the general formula (6) in the polycarbonate resin is preferably 25 mol % or more, more preferably 30 mol % or more, still more preferably 35 mol % or more. When the content of the structural units is excessively small, toughness when the resin is shaped into a film may be poor.

The glass transition temperature of the polycarbonate resin is preferably 110° C. or more and 150° C. or less, more preferably 120° C. or more and 140° C. or less. When the glass transition temperature is excessively low, the heat resistance of the resin tends to deteriorate and hence the resin may cause a dimensional change after its forming into a film. In addition, the image quality of an organic EL panel to be obtained may reduce. When the glass transition temperature is excessively high, the forming stability of the resin at the time of its forming into a film may deteriorate. In addition, the transparency of the film may be impaired. It should be noted that the glass transition temperature is determined in conformity with JIS K 7121 (1987).

The molecular weight of the polycarbonate resin can be represented by a reduced viscosity. The reduced viscosity is measured as follows: a solution of the resin is prepared by using methylene chloride as a solvent while precisely adjusting a polycarbonate concentration to 0.6 g/dL, and the reduced viscosity of the solution is measured with an Ubbelohde viscosity tube at a temperature of 20.0° C.±0.1° C. In ordinary cases, a lower limit for the reduced viscosity is preferably 0.30 dL/g, more preferably 0.35 dL/g or more. In ordinary cases, an upper limit for the reduced viscosity is preferably 1.20 dL/g, more preferably 1.00 dL/g, still more preferably 0.80 dL/g. When the reduced viscosity is less than the lower limit, a problem in that the mechanical strength of a formed article reduces may arise. On the other hand, when the reduced viscosity is more than the upper limit, a problem in that the flowability of the resin upon its forming reduces, and hence productivity or formability reduces may arise.

The retardation film is typically produced by stretching a resin film in at least one direction.

Any appropriate method may be adopted as a method of forming the resin film. Examples thereof include a melt extrusion method (such as a T die forming method), a cast coating method (such as a casting method), a calender forming method, a hot press method, a co-extrusion method, a co-melting method, multilayer extrusion, and an inflation forming method. Of those, a T die forming method, a casting method, and an inflation molding method are preferably used.

The thickness of the resin film (unstretched film) may be set to any appropriate value depending on, for example, desired optical characteristics and stretching conditions to be described later. The thickness is preferably from 50 μm to 300 μm.

Any appropriate stretching method and stretching conditions (such as a stretching temperature, a stretching ratio, and a stretching direction) may be adopted for the stretching. Specifically, one kind of various stretching methods such as free-end stretching, fixed-end stretching, free-end shrinkage, and fixed-end shrinkage may be employed alone, or two or more kinds thereof may be employed simultaneously or sequentially. With regard to the stretching direction, the stretching may be performed in various directions or dimensions such as a horizontal direction, a vertical direction, a thickness direction, and a diagonal direction. When the glass transition temperature of the resin film is represented by Tg, the stretching temperature ranges preferably from Tg−30° C. to Tg+60° C., more preferably from Tg−10° C. to Tg+50° C.

A retardation film having the desired optical characteristics (such as a refractive index ellipsoid, an in-plane retardation, and an Nz coefficient) can be obtained by appropriately selecting the stretching method and stretching conditions.

In one embodiment, the retardation film is produced by subjecting the resin film to uniaxial stretching or fixed-end uniaxial stretching. The fixed-end uniaxial stretching is, for example, a method involving stretching the resin film in its widthwise direction (lateral direction) while running the film in its lengthwise direction. The stretching ratio is preferably from 110% to 350%.

In another embodiment, the retardation film is produced by obliquely stretching a resin film having a long shape in a direction at the angle θ with respect to its lengthwise direction in a continuous manner. Adopting the oblique stretching provides a stretched film having a long shape with an alignment angle of the angle θ with respect to the lengthwise direction of the film, enables a roll-to-roll process upon, for example, its lamination with the polarizer, and can simplify a production process.

A stretching machine to be used in the oblique stretching is, for example, a tenter-type stretching machine capable of applying a feeding force or tensile force, or take-up force having different speeds on left and right sides in a lateral direction and/or a longitudinal direction. Although the tenter-type stretching machine comes in, for example, a lateral uniaxial stretching machine and a simultaneous biaxial stretching machine, any appropriate stretching machine may be used as long as the machine can obliquely stretch the resin film having a long shape in a continuous manner.

The thickness of the retardation film (stretched film) is preferably from 20 μm to 100 μm, more preferably from 30 μm to 80 μm, still more preferably from 30 μm to 65 μm.

A-3. Protective Film

The protective film is formed of any appropriate film that may be used as a protective layer for the polarizer. Specific examples of a material serving as a main component of the film include transparent resins such as a cellulose-based resin such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth)acrylic resin, and an acetate-based resin. Another example thereof is a thermosetting resin or a UV-curable resin such as a (meth)acrylic resin, a urethane-based resin, a (meth)acrylic urethane-based resin, an epoxy-based resin, or a silicone-based resin. Still another example thereof is a glassy polymer such as a siloxane-based polymer. Further, a polymer film described in JP 2001-343529 A (WO 01/37007 A1) may also be used. As a material for the film, for example, there may be used a resin composition containing a thermoplastic resin having a substituted or unsubstituted imide group in a side chain and a thermoplastic resin having a substituted or unsubstituted phenyl group and a nitrile group in a side chain. An example thereof is a resin composition containing an alternate copolymer formed of isobutene and N-methylmaleimide and an acrylonitrile-styrene copolymer. The polymer film may be an extruded product of the resin composition, for example.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit for the Tg of the (meth)acrylic resin is not particularly limited, and is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates such as polymethyl methacrylate, a methyl methacrylate-(meth)acrylic acid copolymer, a methyl methacrylate-(meth)acrylate copolymer, a methyl methacrylate-acrylate-(meth)acrylic acid copolymer, a methyl(meth)acrylate-styrene copolymer (such as an MS resin), and a polymer having an alicyclic hydrocarbon group (such as a methyl metharylate-cyclohexyl methacrylate copolymer or a methyl methacrylate-norbornyl(meth)acrylate copolymer). Preferred examples thereof include poly (C$_{1-6}$ alkyl(meth)acrylates) such as polymethyl(meth)acrylate. A more preferred example thereof is a methyl methacrylate-based resin containing methyl methacrylate as a main component (from 50 to 100 wt %, preferably from 70 to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule described in JP 2004-70296 A, and a (meth)acrylic resin with a high Tg obtained by intramolecular cross-linking or an intramolecular cyclization reaction.

The (meth)acrylic resin is particularly preferably a (meth) acrylic resin having a lactone ring structure because of having high heat resistance, high transparency, and high mechanical strength.

Examples of the (meth)acrylic resin having a lactone ring structure include (meth)acrylic resins each having a lactone ring structure described in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more because excellent durability can be obtained. An upper limit value for the Tg of the (meth)acrylic resin having a lactone ring structure is not particularly limited, and is preferably 170° C. or less from the viewpoint of formability or the like.

It should be noted that the term "(meth)acrylic" as used herein refers to acrylic and/or methacrylic.

The protective film 20 (first protective film 21) to be arranged on an opposite side to the retardation film with respect to the polarizer may be subjected to surface treatment such as hard coat treatment, antireflection treatment, sticking prevention treatment, or antiglare treatment as required. The thickness of the protective film (first protective film) is typically 5 mm or less, preferably 1 mm or less, more preferably from 1 µm to 500 µm, still more preferably from 5 µm to 150 µm.

As described above, it is preferred that the second protective film 22 to be arranged between the polarizer 10 and the retardation film 30 be optically isotropic. The phrase "optically isotropic" as used herein means that the in-plane retardation Re(550) of the film is from 0 nm to 10 nm and the thickness direction retardation Rth (550) thereof is from −10 nm to +10 nm. In addition, the optically anisotropic layer refers to, for example, a layer having an in-plane retardation Re(550) of more than 10 nm and/or a thickness direction retardation Rth(550) of less than −10 nm or more than 10 nm.

The thickness of the second protective film is preferably from 5 µm to 200 µm, more preferably from 10 µm to 100 µm, still more preferably from 15 µm to 95 µm.

A-4. Others

Any appropriate pressure-sensitive adhesive layer or adhesive layer is used in the lamination of the respective layers for constituting the polarizing plate of the present invention. The pressure-sensitive adhesive layer is typically formed of an acrylic pressure-sensitive adhesive. The adhesive layer is typically formed of a polyvinyl alcohol-based adhesive.

Although not shown, a pressure-sensitive adhesive layer may be formed on the polarizing plate 100, 100' on the retardation film 30 side. When the pressure-sensitive adhesive layer is formed in advance, the polarizing plate can be easily bonded to any other optical member (such as an organic EL panel). It should be noted that a release film is preferably attached to the surface of the pressure-sensitive adhesive layer until the layer is used.

B. Organic EL Panel

An organic EL panel of the present invention includes the polarizing plate on its viewer side. The polarizing plate is laminated so that the retardation film may be on the organic EL panel side (the polarizer may be on the viewer side).

EXAMPLES

Hereinafter, the present invention is specifically described by way of Examples. However, the present invention is not limited by Examples. It should be noted that methods of measuring characteristics are as described below.

(1) Thickness

Measurement was performed with a dial gauge (manufactured by PEACOCK, product name: "DG-205", a dial gauge stand (product name "pds-2")).

(2) Retardation

Measurement was performed by using Axoscan manufactured by Axometrics. Measurement wavelengths were 450 nm and 550 nm, and a measurement temperature was 23° C. It should be noted that a film piece measuring 50 mm by 50 mm was cut out of a retardation film and used as a measurement sample.

(3) Alignment Angle

A measurement sample was placed on the measuring table of Axoscan manufactured by Axometrics in a parallel manner, and the alignment angle of a retardation film was measured. It should be noted that a film piece measuring 50 mm by 50 mm was cut out of the retardation film and used as the measurement sample. At that time, the film piece was cut out so that one side thereof was parallel to the lengthwise direction of the retardation film having a long shape.

(4) Reflection Hue and Reflectance

The resultant organic EL panel was caused to display a black image, and its reflection hue and reflectance were measured with a spectrocolorimeter "CM-2600d" manufactured by KONICA MINOLTA, INC. It should be noted that a change Δxy in front hue represents a moving distance on a chromaticity diagram when the in-plane retardation Re of the retardation film is changed in the range of from 137 to 147 nm, and a distance from a neutral hue represents a distance from (x, y)=(0.33, 0.329) on the chromaticity diagram.

Example 1

Production of Polycarbonate Resin Film 26.2 Parts by mass of isosorbide (ISB), 100.5 parts by mass of 9,9-[4-(2-hydroxyethoxy)phenyl]fluorene (BHEPF), 10.7 parts by mass of 1,4-cyclohexanedimethanol (1,4-CHDM), 105.1 parts by mass of diphenyl carbonate (DPC), and 0.591 part by mass of cesium carbonate (0.2 mass % aqueous solution) as a catalyst were loaded into a reaction vessel. Under a nitrogen atmosphere, as the first step of a reaction, the heating medium temperature of the reaction vessel was set to 150° C., and the raw materials were dissolved (for about 15 minutes) while being stirred as required.

Next, a pressure in the reaction vessel was increased from normal pressure to 13.3 kPa, and produced phenol was extracted to the outside of the reaction vessel while the heating medium temperature of the reaction vessel was increased to 190° C. in 1 hour.

A temperature in the reaction vessel was held at 190° C. for 15 minutes. After that, as a second step, the pressure in the reaction vessel was set to 6.67 kPa, the heating medium temperature of the reaction vessel was increased to 230° C. in 15 minutes, and the produced phenol was extracted to the outside of the reaction vessel. The temperature was increased to 250° C. in 8 minutes because the stirring torque of a stirring machine increased. In order for the produced phenol to be further removed, the pressure in the reaction vessel was reduced to 0.200 kPa or less. After the stirring torque had reached a predetermined value, the reaction was completed, and a produced reaction product was extruded into water and then pelletized. Thus, a polycarbonate resin A having a ratio "BHEPF/ISB/1,4-CHDM" of 47.4 mol %/37.1 mol %/15.5 mol % was obtained.

The resultant polycarbonate resin A had a glass transition temperature of 136.6° C. and a reduced viscosity of 0.395 dL/g.

The resultant polycarbonate resin A was dried in a vacuum at 80° C. for 5 hours. After that, a polycarbonate resin film having a thickness of 120 μm was produced by using a film-producing apparatus including a uniaxial extruder (manufactured by Isuzu Kakoki, screw diameter: 25 mm, cylinder preset temperature: 220° C.), a T-die (width: 200 mm, preset temperature: 220° C.), a chill roll (preset temperature: 120 to 130° C.), and a rolling machine.

(Production of Retardation Film)

The resultant polycarbonate resin film was laterally stretched with a tenter stretching machine to provide a retardation film having a thickness of 50 μm. At that time, a stretching ratio was 250% and a stretching temperature was set to from 137 to 139° C.

The resultant retardation film had an Re(550) of from 137 to 147 nm, a ratio "Re(450)/Re(550)" of 0.89, an Nz coefficient of 1.21, and an alignment angle of 90° with respect to its lengthwise direction.

(Production of Polarizing Plate)

An acrylic pressure-sensitive adhesive was applied onto one side of each of the resultant retardation film and a polarizing film having a construction "protective film with a surface-treated layer (thickness: 45 μm)/polarizer/protective film (thickness: 20 μm, Re(550): 0 nm, Rth(550): 0 nm)" (manufactured by Nitto Denko Corporation, product name: "CVS1775SDUHC").

A piece measuring 100 mm by 50 mm was cut out of the retardation film in a state where its pressure-sensitive adhesive surface was directed upward. At the time of the cutting, such adjustment that a direction at 41° counterclockwise with respect to the long side direction of the film became a slow axis direction was performed. A piece was similarly cut out of the polarizing film so that its long side direction became an absorption axis direction.

The retardation film was bonded to the pressure-sensitive adhesive surface of the polarizing film that had been cut out, to provide a polarizing plate measuring 100 mm by 50 mm.

(Production of Organic EL Panel)

An organic EL panel was taken out of an organic EL display (manufactured by LG, product name: "15EL9500"), a polarizing film attached to the organic EL panel was peeled, and the obtained polarizing plate was bonded thereto instead. Thus, an organic EL panel was obtained.

Figure 2:
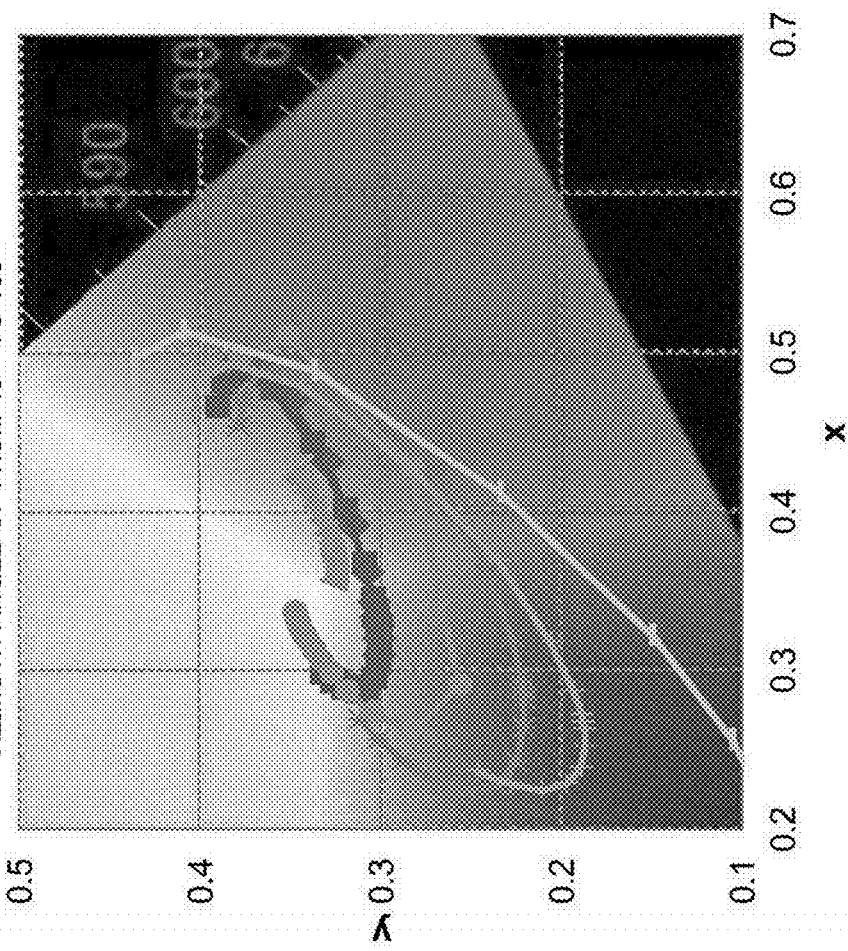
FIG. 2 is a chromaticity diagram showing the viewing angle characteristics of the reflection hues of the respective organic EL panels of Examples and Comparative Examples.
Figure 2:
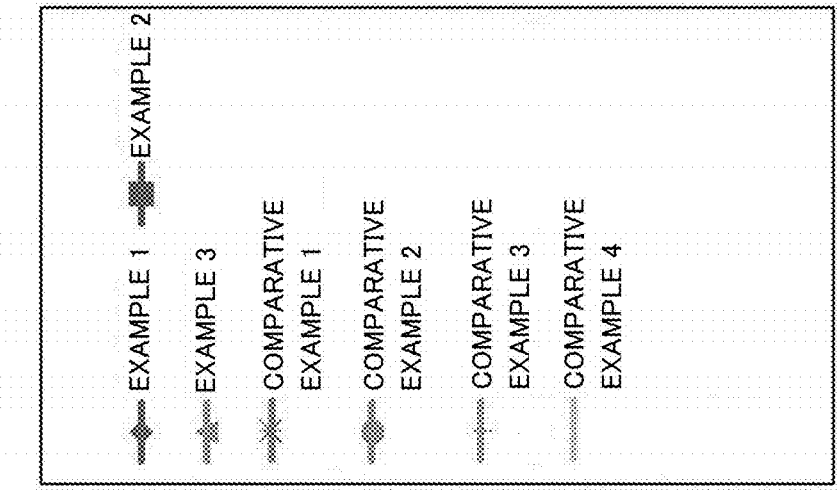

Table 1 shows the results of the front hue and front reflectance of the organic EL panel, and FIG. 2 shows the viewing angle characteristics of its reflection hue (hue changes in a front direction, and a direction at a polar angle of 45° and an azimuth angle of from 45° to 135°).

Example 2

An organic EL panel was produced in the same manner as in Example 1 except that in the production of the polarizing plate, at the time of the cutting of the retardation film, such adjustment that a direction at 43° counterclockwise with respect to the long side direction of the film became a slow axis direction was performed.

Table 1 shows the results of the front hue and front reflectance of the organic EL panel, and FIG. 2 shows the viewing angle characteristics of its reflection hue (hue changes in a front direction, and a direction at a polar angle of 45° and an azimuth angle of from 45° to 135°).

Example 3

An organic EL panel was produced in the same manner as in Example 1 except that in the production of the polarizing plate, at the time of the cutting of the retardation film, such adjustment that a direction at 38° counterclockwise with respect to the long side direction of the film became a slow axis direction was performed.

Table 1 shows the results of the front hue and front reflectance of the organic EL panel, and FIG. 2 shows the viewing angle characteristics of its reflection hue (hue changes in a front direction, and a direction at a polar angle of 45° and an azimuth angle of from 45° to 135°).

Comparative Example 1

An organic EL panel was produced in the same manner as in Example 1 except that in the production of the polarizing plate, at the time of the cutting of the retardation film, such adjustment that a direction at 45° counterclockwise with respect to the long side direction of the film became a slow axis direction was performed.

Table 1 shows the results of the front hue and front reflectance of the organic EL panel, and FIG. 2 shows the viewing angle characteristics of its reflection hue (hue changes in a front direction, and a direction at a polar angle of 45° and an azimuth angle of from 45° to 135°).

Comparative Example 2

An organic EL panel was produced in the same manner as in Example 1 except that in the production of the polarizing plate, at the time of the cutting of the retardation film, such adjustment that a direction at 37° counterclockwise with respect to the long side direction of the film became a slow axis direction was performed.

Table 1 shows the results of the front hue and front reflectance of the organic EL panel, and FIG. 2 shows the viewing angle characteristics of its reflection hue (hue changes in a front direction, and a direction at a polar angle of 45° and an azimuth angle of from 45° to 135°).

Comparative Example 3

An organic EL panel was produced in the same manner as in Example 2 except that the below-indicated film was used as a retardation film.

Table 1 shows the results of the front hue and front reflectance of the organic EL panel, and FIG. 2 shows the viewing angle characteristics of its reflection hue (hue changes in a front direction, and a direction at a polar angle of 45° and an azimuth angle of from 45° to 135°).

(Production of Retardation Film)

A norbornene-based resin film having a thickness of 130 μm (manufactured by JSR Corporation, product name: "ARTON7", glass transition temperature: 132° C.) was longitudinally stretched with a zone stretching machine. At that time, a stretching ratio was 130% and a stretching temperature was set to 138° C. After that, the resultant was laterally stretched with a tenter stretching machine to provide a retardation film having a thickness of from 46 to 48 μm. At that time, a stretching ratio was from 240 to 260% and a stretching temperature was set to from 145 to 147° C.

The resultant retardation film had an Re(550) of from 137 to 147 nm, a ratio "Re(450)/Re(550)" of 1, an Nz coefficient of 1.60, and an alignment angle of 90° with respect to its lengthwise direction.

Comparative Example 4

An organic EL panel was produced in the same manner as in Comparative Example 3 except that in the production of the polarizing plate, at the time of the cutting of the retardation film, such adjustment that a direction at 45° counterclockwise with respect to the long side direction of the film became a slow axis direction was performed.

Table 1 shows the results of the front hue and front reflectance of the organic EL panel, and FIG. 2 shows the viewing angle characteristics of its reflection hue (hue changes in a front direction, and a direction at a polar angle of 45° and an azimuth angle of from 45° to 135°).

TABLE 1

|  | Optical axis angle (°) | Wavelength dispersion characteristic | Change in front hue Δxy | Distance from neutral hue | Front reflectance |
|---|---|---|---|---|---|
| Example 1 | 41 | 0.89 | 0.14 | 0.04 | 0.96 |
| Example 2 | 43 | 0.89 | 0.17 | 0.11 | 0.42 |
| Example 3 | 38 | 0.89 | 0.07 | 0.02 | 2.40 |
| Comparative Example 1 | 45 | 0.89 | 0.27 | 0.17 | 0.24 |
| Comparative Example 2 | 37 | 0.89 | 0.06 | 0.03 | 3.05 |
| Comparative Example 3 | 43 | 1 | 0.10 | 0.22 | 0.69 |
| Comparative Example 4 | 45 | 1 | 0.11 | 0.25 | 0.51 |

In each of Examples, both the change in reflection hue due to the change in retardation of the retardation film and the distance from the neutral hue were small while a low front reflectance was maintained. On the other hand, in Comparative Example 1, the change in reflection hue due to the change in retardation of the retardation film was large and the distance from the neutral hue was also large. In addition, in Comparative Example 2, the front reflectance was high, and in each of Comparative Example 3 and Comparative Example 4, the distance from the neutral hue was large.

In addition, as shown in FIG. 2, Examples were each confirmed to show a small change in reflection hue due to a viewing angle and an excellent viewing angle characteristic as compared with each of Comparative Examples.

INDUSTRIAL APPLICABILITY

The polarizing plate of the present invention is suitably used in an organic EL device.

REFERENCE SIGNS LIST 10 polarizer
20 protective film
21 first protective film
22 second protective film
30 retardation film
100 polarizing plate
100' polarizing plate

The invention claimed is:

1. A polarizing plate for an organic EL panel, comprising:
a polarizer; and
a retardation film,
wherein:
in-plane retardations of the retardation film satisfy a relationship of Re(450)<Re(550); and
an angle θ formed between an absorption axis of the polarizer and a slow axis of the retardation film satisfies a relationship of 38°≤θ≤44° or of 46°≤θ≤52°, where the angle θ formed between an absorption axis of the polarizer and a slow axis of the retardation film is not 45°;
where Re(450) represents an in-plane retardation measured at 23° C. with light having a wavelength of 450 nm and Re(550) represents an in-plane retardation measured at 23° C. with light having a wavelength of 550 nm.

2. The polarizing plate according to claim 1, wherein the polarizing plate is free of an optically anisotropic layer between the polarizer and the retardation film.

3. The polarizing plate according to claim 1, wherein the in-plane retardation Re(550) of the retardation film is from 130 nm to 160 nm.

4. The polarizing plate according to claim 1, wherein the retardation film has an Nz coefficient of from 1.05 to 1.3, wherein the Nz coefficient is determined from the equation Nz=Rth/Re, wherein Rth represents a thickness direction retardation and Re represents an in-plane retardation.

5. An organic EL panel, comprising the polarizing plate according to claim 1.

6. The polarizing plate according to claim 2, wherein the in-plane retardation Re(550) of the retardation film is from 130 nm to 160 nm.

7. The polarizing plate according to claim 2, wherein the retardation film has an Nz coefficient of from 1.05 to 1.3, wherein the Nz coefficient is determined from the equation Nz=Rth/Re, wherein Rth represents a thickness direction retardation and Re represents an in-plane retardation.

8. The polarizing plate according to claim 3, wherein the retardation film has an Nz coefficient of from 1.05 to 1.3, wherein the Nz coefficient is determined from the equation Nz=Rth/Re, wherein Rth represents a thickness direction retardation and Re represents an in-plane retardation.

9. An organic EL panel, comprising the polarizing plate according to claim 2.

10. An organic EL panel, comprising the polarizing plate according to claim 3.

11. An organic EL panel, comprising the polarizing plate according to claim 4.

* * * * *